US008541856B2

(12) United States Patent
Massetti

(10) Patent No.: US 8,541,856 B2
(45) Date of Patent: Sep. 24, 2013

(54) OPTICAL TOUCH-SCREEN IMAGER

(75) Inventor: Dominic Massetti, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 384 days.

(21) Appl. No.: 12/963,446

(22) Filed: Dec. 8, 2010

(65) Prior Publication Data

US 2012/0146947 A1 Jun. 14, 2012

(51) Int. Cl.
*H01L 27/14* (2006.01)
(52) U.S. Cl.
USPC ............. 257/431; 345/175; 250/216; 385/12
(58) Field of Classification Search
USPC ...... 345/173–184; 178/18.09; 257/225–234, 257/431–466; 250/216–227.32, 208.1; 348/308; 385/12–13
See application file for complete search history.

(56) References Cited

U.S. PATENT DOCUMENTS

| | | | |
|---|---|---|---|
| 7,068,396 B1 * | 6/2006 | Gallagher et al. | 358/3.01 |
| 7,355,594 B2 | 4/2008 | Barkan | |
| 7,627,209 B2 * | 12/2009 | Hikita | 385/32 |
| 7,646,943 B1 * | 1/2010 | Wober | 385/12 |
| 2004/0212603 A1 * | 10/2004 | Cok | 345/175 |
| 2010/0128006 A1 * | 5/2010 | Shimizu | 345/175 |
| 2010/0259508 A1 * | 10/2010 | Nishio et al. | 345/175 |
| 2011/0063604 A1 * | 3/2011 | Hamre et al. | 356/71 |
| 2011/0115705 A1 * | 5/2011 | Watanabe | 345/158 |

* cited by examiner

*Primary Examiner* — Liliana Cerullo
(74) *Attorney, Agent, or Firm* — Blakely Sokoloff Taylor & Zafman LLP

(57) ABSTRACT

Embodiments of an apparatus comprising a CMOS image sensor including a pixel array formed in a substrate and a light guide formed on the substrate to receive light traveling in a plane parallel to a plane of the pixel array and incident on the edge of the image sensor and to re-direct the incident light into at least one pixel of the pixel array. Embodiments of an optical touch-screen imager comprising a substantially planar touch area and a detector positioned adjacent to the touch area, the detector comprising a CMOS image sensor as described above.

33 Claims, 9 Drawing Sheets

OPTICAL TOUCH-SCREEN IMAGER

TECHNICAL FIELD

The present invention relates generally to image sensor and in particular, but not exclusively, to an optical touch-screen imager.

BACKGROUND

Touch screens are well known on many devices such as personal digital assistants, payment terminals, and portable computers. The most common touch screen uses flexible membrane technology, but these membranes are not durable and the membranes are positioned over the display, reducing the brightness and contrast of the display.

Another touch-screen technology uses infrared (IR) light-emitting diodes (LEDs) positioned around the periphery of a screen. One type consists of an array of photosensors along two sides of a display, and a corresponding array of IR light sources, such as LEDs, along the opposite sides. The photosensors detect when an object touches the screen by detecting that IR light from the opposite LED is no longer visible to a sensor. This technology works well, but for adequate resolution it requires such a dense population of sensors and LEDs that it can become too expensive and too power-hungry for some applications. In addition, such an arrangement is not scalable, meaning that custom arrays of LEDs and sensors must be created for each screen size.

Another type of technology replaces the IR photosensors with a smaller number of cameras, but these cameras are bulky, making the touch-screen large, thick, heavy and not very user-friendly.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Embodiments of a system and method for an optical touch-screen imager are described below. In the following description, numerous specific details are described to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail but are nonetheless encompassed within the scope of the invention.

Reference throughout this specification to "one embodiment" or "an embodiment" means that a particular feature, structure, or characteristic described in connection with the embodiment is included in at least one embodiment of the present invention. Hence, appearances of the phrases "in one embodiment" or "in an embodiment" in this specification do not necessarily all refer to the same embodiment. Furthermore, the particular features, structures, or characteristics may be combined in any suitable manner in one or more embodiments.

Figure 1A:
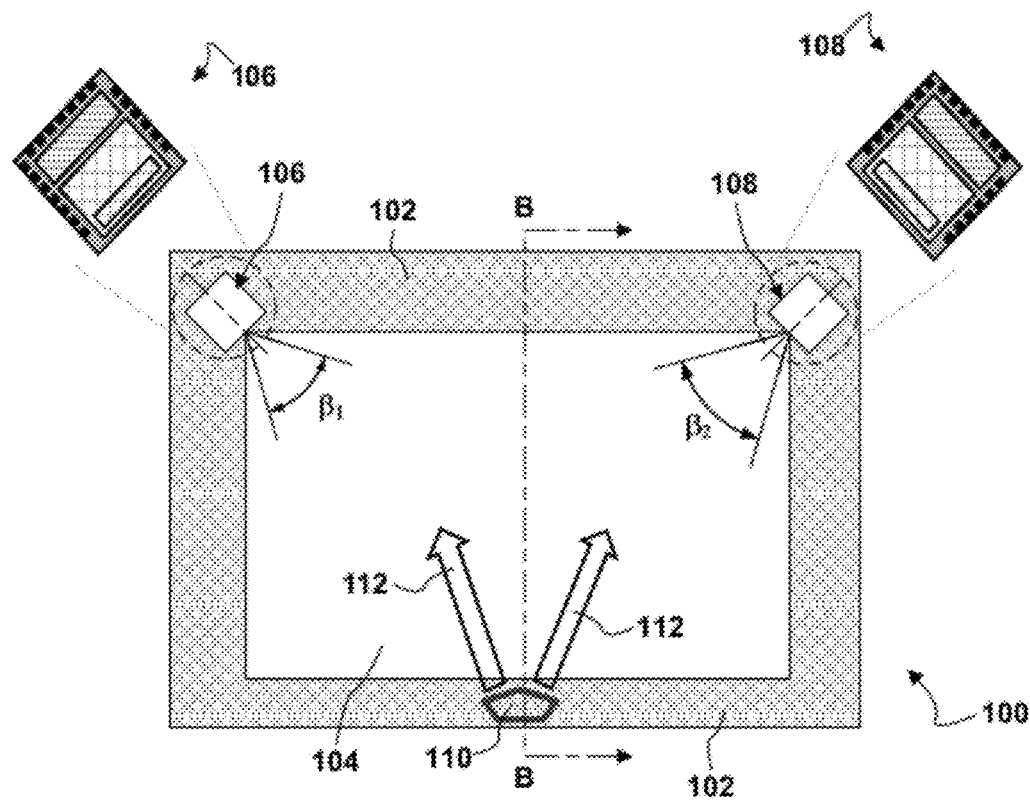
FIG. 1A is a plan view of an embodiment of an optical touch-screen imager.
Figure 1B:
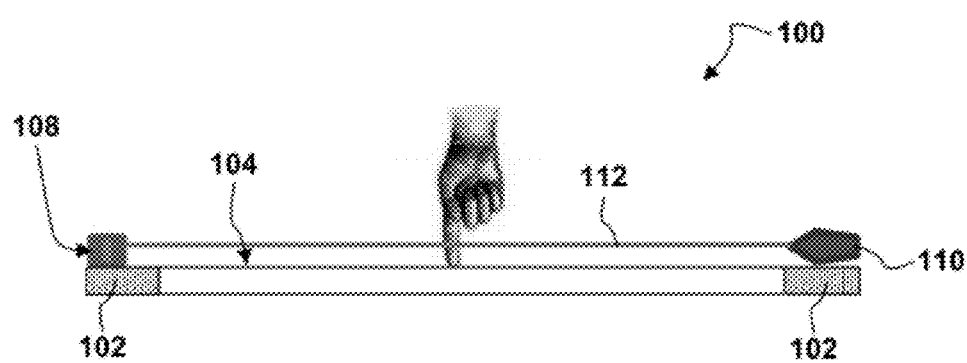
FIG. 1B is a cross-sectional view of the embodiment of an optical touch-screen imager of FIG. 1A, taken substantially along section line B-B.

FIGS. 1A-1B together illustrate an embodiment of an optical touch-screen imager 100. Touch screen imager 100 includes a touch area 104 surrounded by a frame 102. In the illustrated embodiment both frame 102 and touch area 104 are quadrilateral, but in other embodiments both can have other shapes, such as circular, elliptical, or some other regular or irregular polygon. In still other embodiments, frame 102 and touch area 104 need not have the same shape. Additionally, although the illustrated embodiment shows touch area 104 completely surrounded by frame 102, in other embodiments frame 102 can be on fewer sides of touch area 104.

A pair of image sensors 106 and 108 are positioned along frame 102 at two corners of touch area 104. Image sensor 106 has an angular field of view $\beta_1$, while image sensor 108 has an angular field of view $\beta_2$. In one embodiment, $\beta_1$ and $\beta_2$ are equal, but in other embodiments $\beta_1$ and $\beta_2$ need not be equal. Each of $\beta_1$ and $\beta_2$ can have a value between zero and 90 degrees. In an embodiment in which $\beta_1$ and $\beta_2$ are both equal to 90 degrees, image sensors 106 and 108 both have a field of view that completely covers touch area 104. The illustrated embodiment of touch screen imager 100 has two image sensors, but other embodiments can have a lesser or greater number of image sensors. For example, one embodiment can have only one image sensor, while other embodiments can include three, four or more image sensors. Embodiments of image sensors that can be used in touch-screen imager 100 are discussed below in connection with FIGS. 2A-2B, 3, 5 and 6. In one embodiment, image sensors 106 and 108 are coupled to circuitry and logic to condition and process signals generated by the image sensors (see FIG. 7).

A radiation source 110 is positioned on frame 102 along an edge of touch area 104 opposite the edge where image sensors 106 and 108 are positioned, and both image sensors 106 and 108 are positioned to receive radiation 112 emitted by radiation source 110. Radiation source 110 can emit radiation at various wavelengths of the spectrum from infra-red to ultra-violet. In one embodiment, radiation source 110 emits radiation and infra-red (IR) or near-infra-red (NIR) wavelengths, but in other embodiments radiation source 110 can, of course, emit radiation at other wavelengths. In some embodiments, radiation source 110 can include light emitting diodes (LEDs), but in other embodiments other types of radiation sources can be used. Although not illustrated in the figure, radiation source 110 can also include optical elements that condition emitted radiation 112 so that upon leaving radiation source 110 it travels in a thin plane substantially parallel to the plane of touch area 104 (see FIG. 1B). Reflective, refractive or diffractive optical elements, or combinations of these, can all be used for conditioning emitted radiation 112; specific examples of optical elements include prisms, mirrors, lenses, diffraction gratings, optical fibers, waveguides, and so forth.

In operation of touch-screen imager 100, radiation source 110 is turned on and emits radiation 112 in a plane substantially parallel to touch area 104, so that the radiation is directed into image sensors 106 and 108. When a user then places a finger or other object in touch area 104, the finger or object blocks radiation from reaching certain pixels in the image sensors. Using processing circuitry coupled to the image sensors (see FIG. 7), the position of the finger or object within touch area 104 can be identified.

Figure 2A:
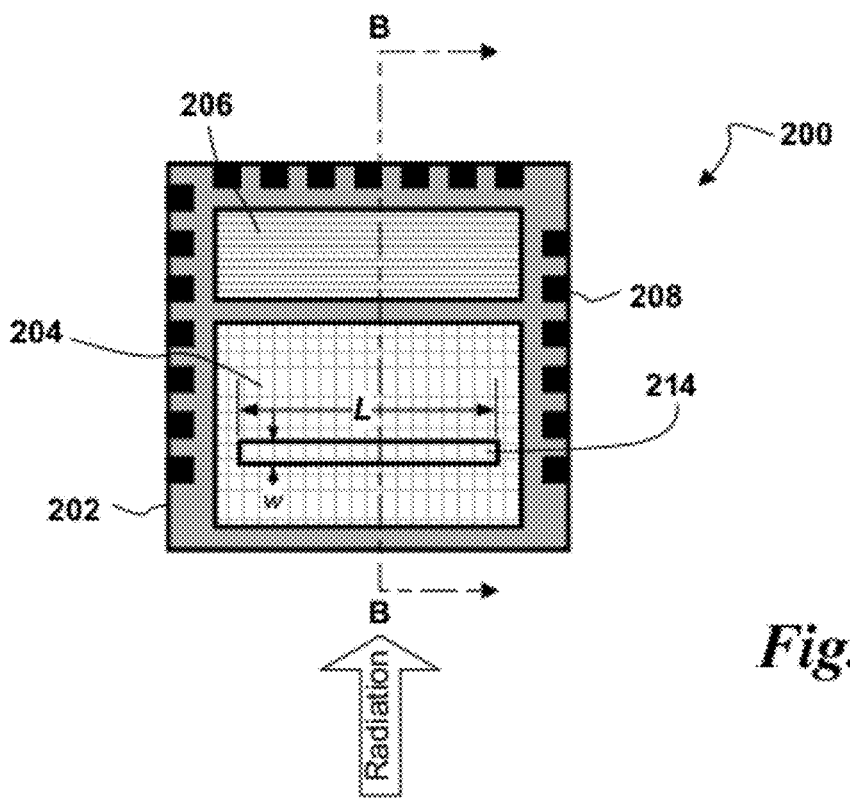
FIG. 2A is a plan view of an embodiment of an image sensor that can be used with an embodiment of an optical touch-screen imager such as the one shown in FIGS. 1A-1B.
Figure 2B:
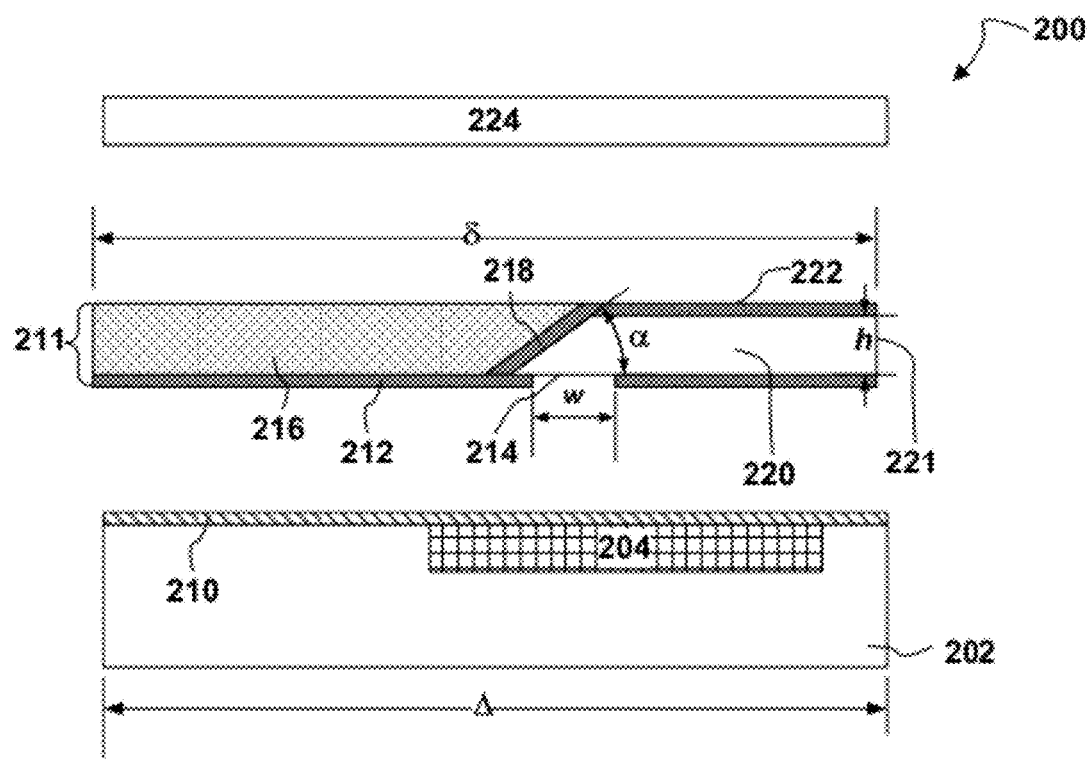
FIG. 2B is an exploded cross-sectional view of the embodiment of an image sensor of FIG. 2A, taken substantially along section line B-B.
Figure 2C:
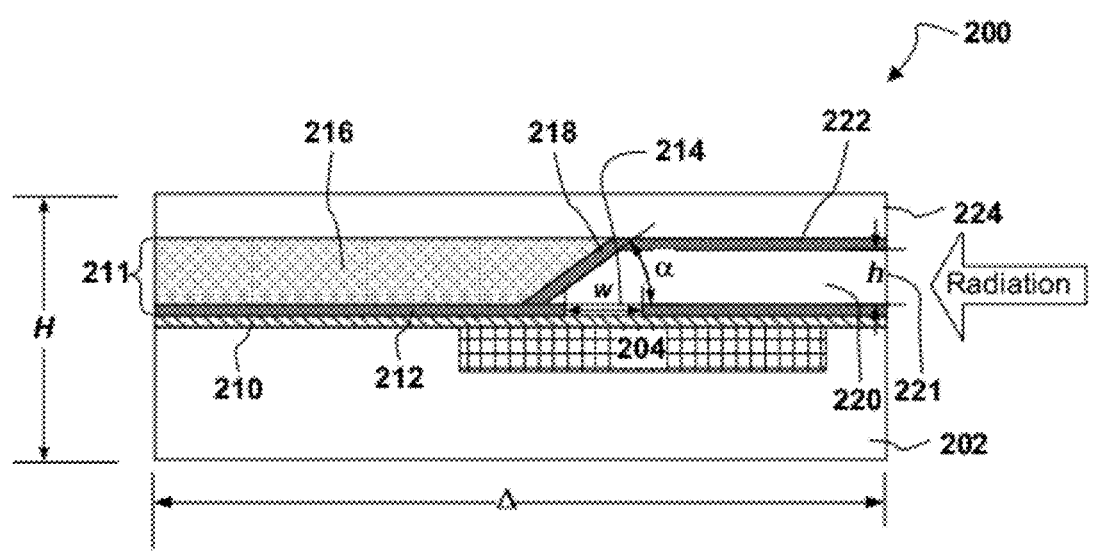
FIG. 2C is an cross-sectional view of the embodiment of an assembled image sensor of FIG. 2B.

FIGS. 2A-2C together illustrate an embodiment of an image sensor 200 that can be used as one or both of image sensors 106 and 108. In the illustrated embodiment, image sensor 200 is a CMOS image sensor, but in other embodiments other types of image sensors such as charge-coupled devices (CCD) can be used. Image sensor 200 is also a frontside-illuminated (FSI) sensor, meaning that it receives radiation through its front side (usually the side on which the pixel array is formed); other embodiments can be backside-illuminated image sensors (see FIG. 5). FIG. 2A illustrates the main elements of image sensor 200. Image sensor 200 includes a substrate 202 on which are formed a pixel array 204 and supporting electronics 206. Individual pixels in pixel array 204 are in communication with one or more elements of supporting electronics 206, and the pixels in pixel array 204, as well as elements of supporting electronics 206, can communicate with elements external to the image sensor 200 through one or more contacts 208.

FIGS. 2B and 2C illustrate details of image sensor 200; FIG. 2B is an exploded view, while FIG. 2C is an assembled view. An anti-reflective coating 210 is formed on the surface of substrate 202 such that it covers at least pixel array 204, and a light guide 211 is then formed over anti-reflective coating 210. When light guide 211 is completed, a cover 224 is placed over the light guide.

In one embodiment pixel array 204 is two-dimensional and includes a plurality of pixels arranged in rows and columns. Illustrated pixel array 204 is regularly shaped, but in other embodiments the array can have a regular or irregular arrangement different than shown and can include more or less pixels, rows, and columns than shown. Moreover, in different embodiments pixel array 204 can be a color image sensor including red, green, and blue pixels or can be a magenta-cyan-yellow image sensor.

Anti-reflective coating 210 can be any kind of coating that reduces or eliminates reflection. In some embodiments, anti-reflective coating 210 can also serve as a filter, filtering out unwanted wavelengths of radiation so that only desired wavelengths reach pixels within pixel array 204. For instance, in one embodiment anti-reflective coating 210 can allow only infra-red or near-infra-red wavelengths to reach the pixel array. In other embodiments, anti-reflective coating 210 can allow other wavelengths, such as visible or ultraviolet wavelengths, to pass. In still other embodiments, anti-reflective coating 210 can allow a broad range of wavelengths to pass.

Light guide 211 is formed on anti-reflective coating 210, and includes metal layer 212 having a slot 214 therein, a layer of planarizing material 216, an inclined metal layer 218, an additional metal layer 222, and an optically transparent material 220. Metal layer 212 is formed on anti-reflective coating 210 and has therein a slot 214 of width w and length L (see FIG. 2A). Slot 214 is formed over pixel array 204, forming a mask that allows radiation to reach one or more selected pixels within pixel array 204. Dimensions w and L, measured in pixels, can have different values in different embodiments. In one embodiment, for example, width w can be a width from one to several thousand pixels, while length L can range from a single line of pixels to the entire width of pixel array 204. Metal layer 212 can be formed using any type of reflective metal, including aluminum, gold, silver, platinum and the like.

Transparent material 220 is formed over the part of metal layer 212 that extends from the edge of image sensor 200 to at least past slot 214; in the illustrated embodiment, transparent material 220 occupies the entire volume bounded by metal layer 212, inclined metal layer 218, additional metal layer 222 and the radiation entry 221 of light guide 211. In the illustrated embodiment radiation entry 221 is flush with the edge of image sensor 200, but in other embodiments the dimensions of light guide 211 and image sensor 200 need not be equal, so that radiation entry 211 need not be flush with the image sensor. For example, in the illustrated embodiment dimension 8 of light guide 211 is substantially equal to dimension $\Delta$ of image sensor (see FIG. 2B), but in other embodiments $\delta$ need not be equal to $\Delta$. Generally, the material chosen for transparent material 220 will depend on the wavelengths of radiation to be captured by image sensor 220; for example, in an embodiment in which anti-reflective layer 210 can be used to allow only infra-red or near-infra-red wavelengths to reach image sensor 204, transparent material 220 would be transparent to at least infra-red and near-infra-red wavelengths. In one embodiment, transparent material 220 can be the same material used for microlenses.

Inclined metal layer 218 is in contact with transparent material 220 and spans between metal layer 212 and additional metal layer 222. Inclined metal layer 218 is substantially planar and is formed at an angle $\alpha$ relative to a plane defined by metal layer 212. In one embodiment, $\alpha$ has a value of 45 degrees, but in other embodiments $\alpha$ can have any value between 0 and 90 degrees, and in still other embodiments $\alpha$ can have values between 15 and 75 degrees. As with metal layer 212, inclined metal layer 218 can be formed using any type of reflective metal, including aluminum, gold, silver, platinum and the like. In one embodiment, inclined metal layer 218 is made of the same metal as metal layers 212 and 222, but in other embodiments in need not be of the same material as either of the other two metal layers.

Additional metal layer 222 is formed on transparent material 220, is spaced apart by a distance h from metal layer 212, and spans between inclined metal layer 218 and radiation entry 221. In one embodiment, distance h is constant and equal to the width of one or more pixels but in other embodiments h can take on different values, and in still other embodiment h need not be constant (i.e., additional metal layer 222 and metal layer 212 need not be substantially parallel). When dimension h is small, the light-acceptance angle of light guide 211 is correspondingly small and hence no additional optics are necessary to focus light, although additional optics can be added in one embodiment. As with metal layer 212, additional metal layer 222 can be formed using any type of reflective metal, including aluminum, gold, silver, platinum and the like. In one embodiment, additional metal layer 222 is made of the same metal as metal layers 212 and 218, but in other embodiments in need not be of the same material as either of the other two metal layers.

As shown in FIG. 2B, planarizing material 216 is formed over part of metal layer 212 and over inclined metal layer 218. In another embodiment planarizing material 216 can be formed over metal layer 222 as well. Planarizing material 216 is used in conjunction with the remaining elements of light guide 211 to form a substantially plane surface on which a cover 224 can be placed. In one embodiment cover 224 can be glass, but in other embodiments other materials can be used.

In operation of image sensor 200, radiation is incident on the edge of image sensor 200 in a plane substantially parallel to the plane of pixel array 204 and substantially aligned with the entrance to light guide 211. The radiation reaches the edge of image sensor 200 and enters transparent materials 220. Transparent material 220, together with reflective metal layers 212 and 222, guide the radiation to inclined metal surface 218, which then reflects the incident radiation toward slot 214 in metal layer 212. The radiation strikes the pixels exposed by slot 214, creating an electrical signal that can be read and processed by appropriate circuitry (see FIG. 7). The construction of image sensor 200 results in a very low overall height H for the image sensor, so that when used in an optical touch-screen 100 the touch screen's frame 102 will have a small thickness and a small weight.

Figure 3:
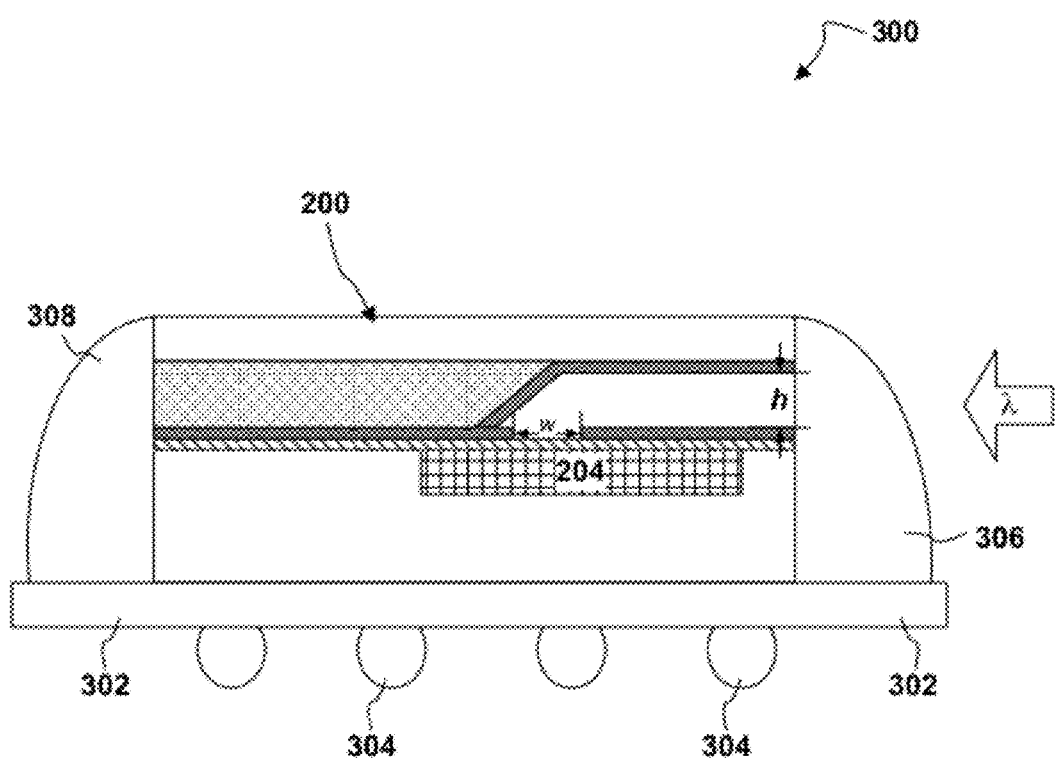
FIG. 3 is a cross-sectional view of an embodiment of an arrangement for packaging an image sensor such as the one shown in FIGS. 2A-2B.

FIG. 3 illustrates an embodiment of a packaged image sensor 300. Packaged image sensor 300 is a chip-scale package (CSP or CSP2) including an image sensor such as image sensor 200 mounted on one side of a substrate 302 while solder balls 304, as well as supporting structures such as bonding pads, are formed on the other side of substrate 302. Image sensor 200 can be electrically coupled through contacts 208 to substrate 302 by various means such as wire bonding, through chip vias, or wafer level packaging technologies such as the Shellcase around the edge wire structure. Substrate 302 provides the necessary electrical interconnections between image sensor 200 and solder balls 304, so that image sensor 200 will then be electrically coupled to whatever device package 300 is attached to by the solder balls. For a BSI image sensor antireflective coating 210 and layers 211 and 224 are all on the back surface while array 204 and contact pads 208 are on the frontside of image sensor 300. In that case contact 208 may connect directly to metal pads on the top side of 302 by means of conductive paste, solder balls, or other means.

Image sensor 200 can be mounted to substrate 302 using adhesives in one embodiment, but in other embodiments other forms of attachment, such as soldering or fasteners, can be used. Once mounted on substrate 302, the edge of image sensor 200 through which light enters light guide 211 can be covered by a clear edge sealant 306. In one embodiment, clear edge sealant 306 can be formed into a lens to help focus incident radiation λ into light guide 211, but in other embodiments clear edge sealant 306 need not form a lens. In some embodiments of package 300, edges of image sensor 200 on which radiation is not incident can also be covered by clear edge sealant 308, but in other embodiments sealant 308 need not be present.

Figure 4A:
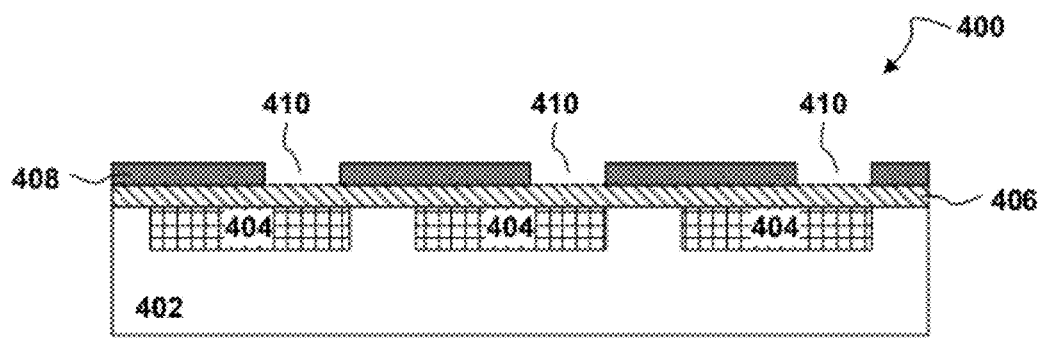
FIGS. 4A-4F are cross-sectional views of an embodiment of a process for manufacturing an embodiment of an image sensor such as the one shown in FIGS. 2A-2B.

FIGS. 4A-4F together illustrate an embodiment of a process for manufacturing a frontside-illuminated (FSI) image sensor such as image sensor 200; the process for manufacturing BSI image sensor 500 (see FIG. 5) is a straightforward extension of the illustrated process. FIG. 4A illustrates the starting point of the process. Several image sensors are formed on a wafer 402. Pixel arrays 404, as well as other optical or electronic components of image sensors, are formed on the front side of a semiconductor wafer 402. Anti-reflective coating 406 is formed over the front side of the wafer such that it at least covers pixel arrays 404. A metal layer 408 is deposited over anti-reflective coating 406, and is then patterned and etched to form slots 410 that expose part of anti-reflective coating 406, hence forming the mask that will allow light to reach some of the pixels of pixel arrays 404.

Figure 4B:
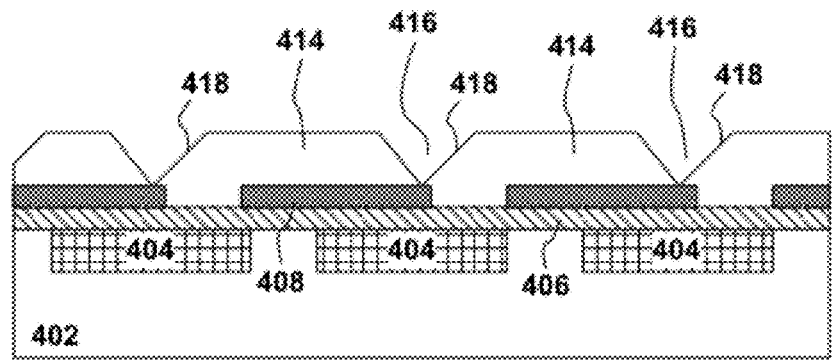

FIG. 4B illustrates another part of the process. Starting with the assembly shown in FIG. 4A, transparent material 414 is then deposited on the surface of the wafer, such that it covers metal layer 408 and fills slots 410. V-shaped notches 416 are formed in optically transparent material 414 to create inclined surfaces such as surfaces 418. Such V-shape notches may also be formed in locations perpendicular to those shown and in the same plane but at the ends of slot 410. These form the ends of the slot.

Figure 4C:
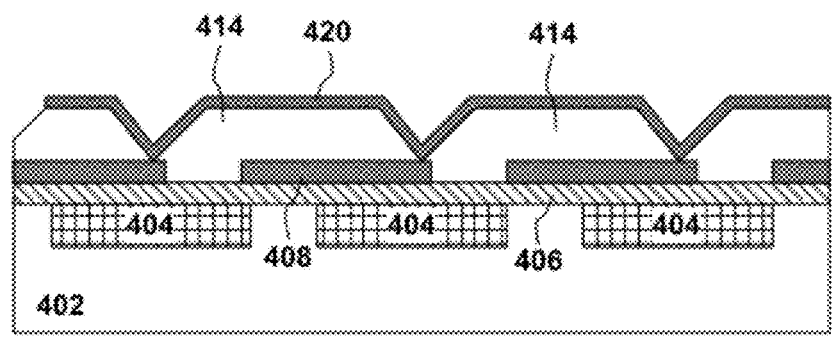

FIG. 4C illustrates another part of the process. Starting with the assembly shown in FIG. 4B, a metal layer 420 is deposited on optically transparent material 414. The part of metal layer 420 that is on inclined surfaces 418 forms the inclined metal surface 218 of the final image sensor, while the part of metal layer 420 that is on the flat surfaces ends up as the additional metal surface 222 in the final image sensor (see FIG. 2B).

Figure 4D:
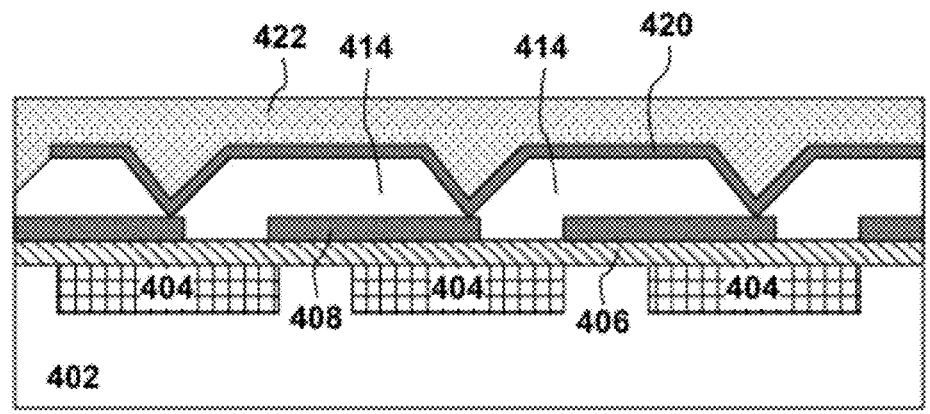
Figure 4E:
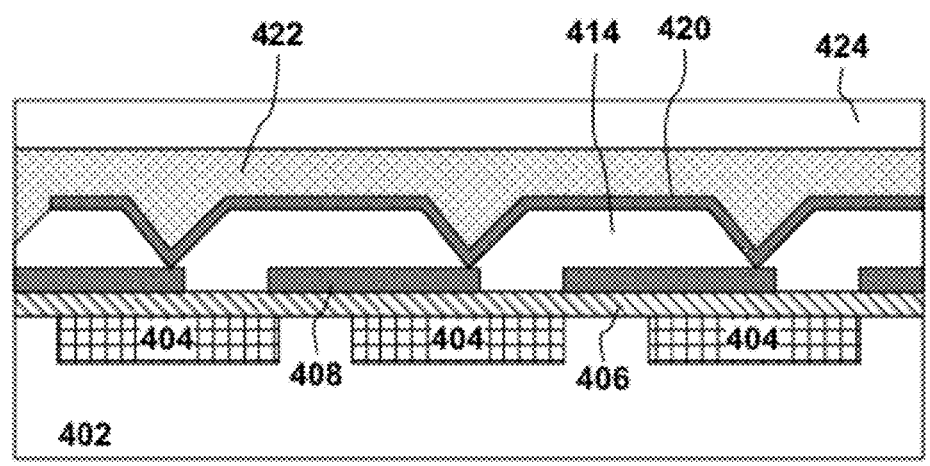
Figure 4F:
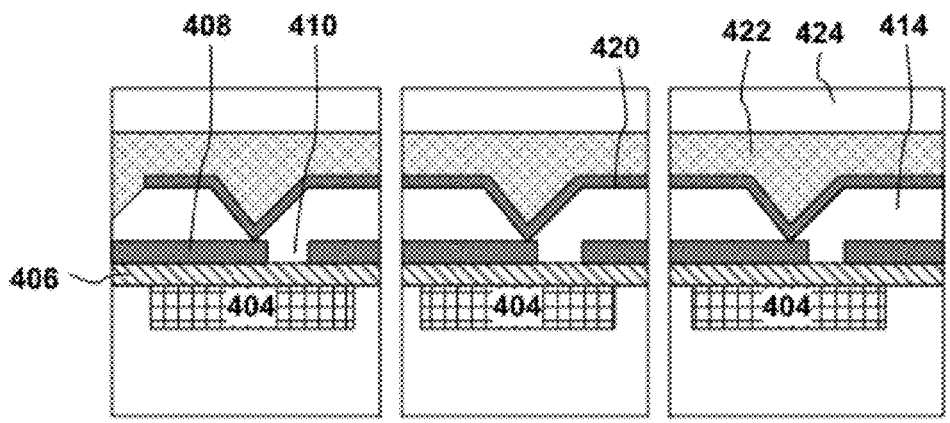

FIGS. 4D-4F illustrates subsequent parts of the process. Starting with the assembly shown in FIG. 4C, in FIG. 4D a planarizing material 422 is deposited over metal layer 420 to form a plane surface on which a cover can be placed. In FIG. 4E, a cover 424 is formed over planarizing material 422. FIG. 4F illustrates the final part of the process, in which wafer 402 is diced to separate individual image sensors from each other. In the embodiment where electrical leads are formed around the edge of the image sensor substrate (Shellcase technique), the die separation step is the same as is used in that process.

Figure 5:
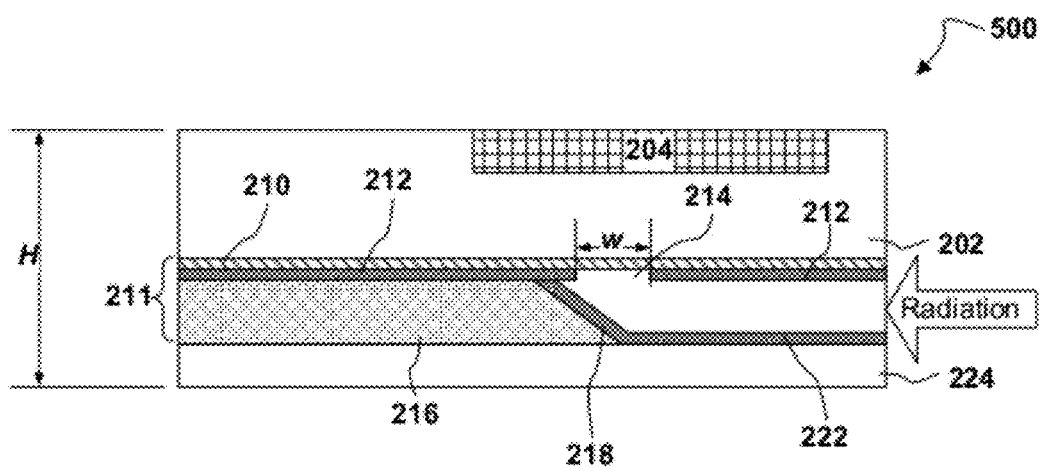
FIG. 5 is a cross-sectional view of an alternative embodiment of an image sensor.

FIG. 5 illustrates an embodiment of a backside-illuminated ("BSI") image sensor 500. Image sensor 500 is in most respects similar to image sensor 200. The primary difference is that image sensor 200 is a frontside-illuminated ("FSI") image sensor. Both FSI image sensor 200 and BSI image sensor 500 include a pixel array 204 fabricated on a front side of substrate 202, but an FSI sensor receives radiation on the front side of the sensor while a BSI sensor receives radiation through a back surface of the image sensor. Hence, in image sensor 500 light guide 211 is formed on the backside of substrate 202 instead of the front side, with slot 214 aligned to direct incident radiation to pixel array 204 through the back side of the substrate. In most respects, BSI image sensor 500 operates the same way as image sensor 200 and could be used as one or both of image sensors 106 and 108 in touch-screen imager 100.

Figure 6:
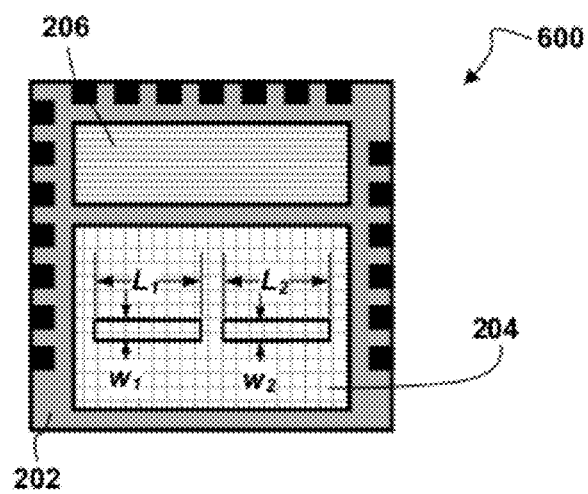
FIG. 6 is a plan view of another alternative embodiment of an image sensor.

FIG. 6 illustrates an alternative embodiment of a frontside-illuminated image sensor 600. Image sensor 600 is in most respects similar to image sensor 200. The primary difference is that image sensor 600 includes multiple slots through which radiation can reach the pixel array 204. The illustrated embodiment includes two slots: one having width $w_1$ and length $L_1$, the other having width $w_2$ and length $L_2$. In one embodiment both slots have the same size, meaning that $w_1=w_2$ and $L_1=L_2$, but in other embodiments $w_1$ need not be equal to $w_2$, and $L_1$ need not equal $L_2$. Also, although the illustrated embodiment shows both slots the same shape, in other embodiments the slots need not have the same shape. The presence of multiple slots can enable the construction of a stereo imager.

Figure 7:
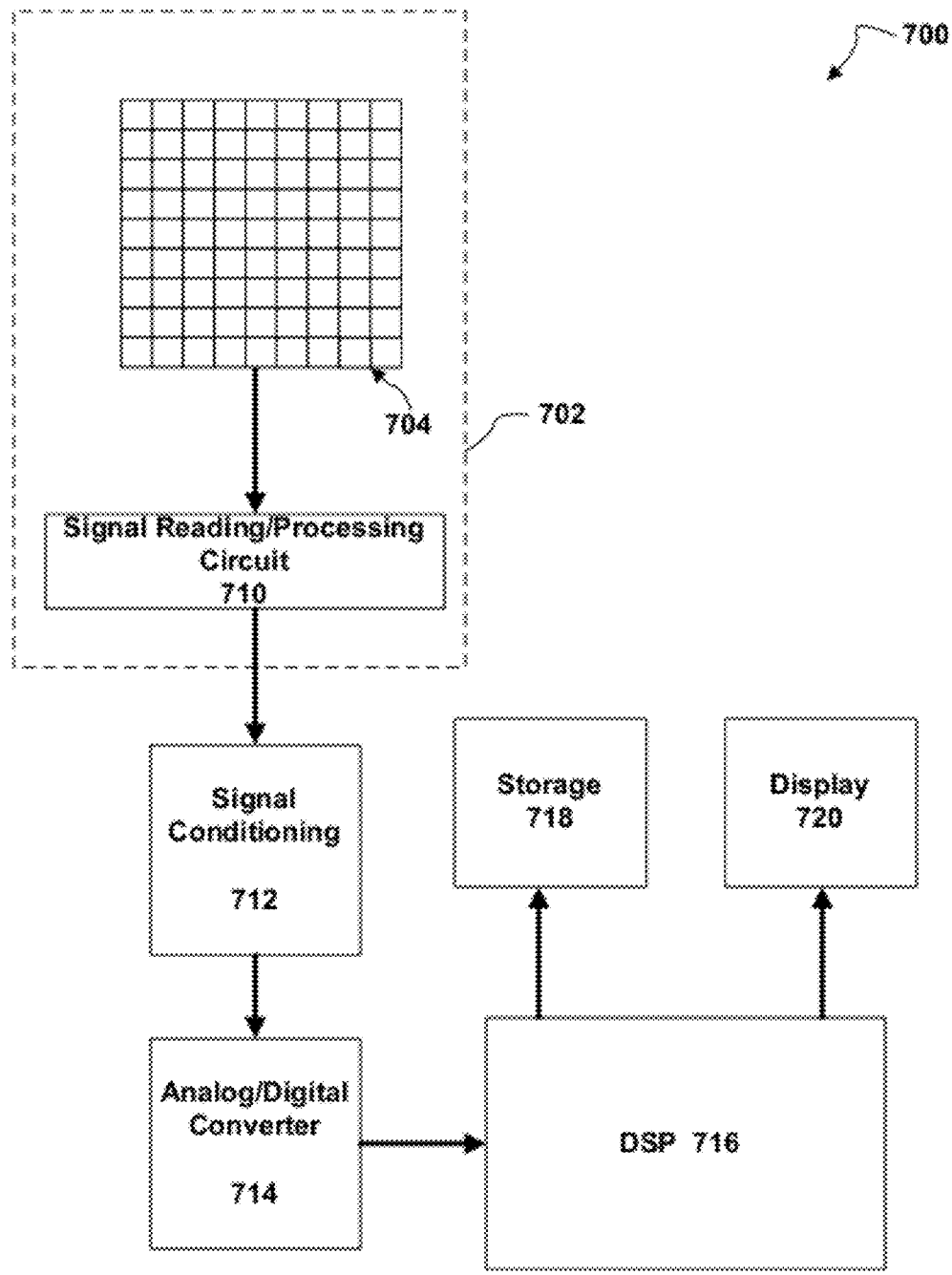
FIG. 7 is a block diagram of an embodiment of a system for processing data from an image sensor.

FIG. 7 illustrates an embodiment of an imaging system 700 for processing information or signals from an image sensor. System 700 can be used to process signals from image sensors 106 and/or 108 in touch-screen 100. Pixel array 704 captures the image and the remainder of system 700 processes the pixel data from the image.

Image sensor 702 can be frontside-illuminated image sensor 200 (FIGS. 2A-2B) or backside-illuminated image sensor 400 (FIG. 5). During operation of pixel array 704 to capture an image, each pixel in pixel array 704 that captures incident light (i.e., photons) during a certain exposure period converts the collected photons into an electrical charge. The electrical charge generated by each pixel can be read out as an analog signal, and a characteristic of the analog signal such as its charge, voltage or current will be representative of the intensity of light that was incident on the pixel during the exposure period.

Image sensor 702 includes signal reading and processing circuit 710. Among other things, circuit 710 can include circuitry and logic that methodically reads analog signals from each pixel, filters these signals, corrects for defective pixels, and so forth. In an embodiment where circuit 710 performs only some reading and processing functions, the remainder of the functions can be performed by one or more other components such as signal conditioner 712 or DSP 716. Although shown in the drawing as an element separate from pixel array 704, in some embodiments reading and processing circuit 710 can be integrated with pixel array 704 on the same substrate or can comprise circuitry and logic embedded within the pixel array. In other embodiments, however, reading and processing circuit 710 can be an element external to pixel array 704 as shown in the drawing. In still other embodiments, reading and processing circuit 710 can be an element not only external to pixel array 704, but also external to image sensor 702.

Signal conditioner 712 is coupled to image sensor 702 to receive and condition analog signals from pixel array 704 and reading and processing circuit 710. In different embodiments, signal conditioner 712 can include various components for conditioning analog signals. Examples of components that can be found in the signal conditioner include filters, amplifiers, offset circuits, automatic gain control, etc. In an embodiment where signal conditioner 712 includes only some of these elements and performs only some conditioning functions, the remaining functions can be performed by one or more other components such as circuit 710 or DSP 716. Analog-to-digital converter (ADC) 714 is coupled to signal conditioner 712 to receive conditioned analog signals corresponding to each pixel in pixel array 704 from signal conditioner 712 and convert these analog signals into digital values.

Digital signal processor (DSP) 716 is coupled to analog-to-digital converter 714 to receive digitized pixel data from ADC 714 and process the digital data to produce a final digital image. DSP 716 can include a processor and an internal memory in which it can store and retrieve data. After the image is processed by DSP 716, it can be output to one or both of a storage unit 718 such as a flash memory or an optical or magnetic storage unit and a display unit 720 such as an LCD screen.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. These modifications can be made to the invention in light of the above detailed description.

The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

The invention claimed is:

1. An apparatus comprising:
a CMOS image sensor including a pixel array formed in a CMOS image sensor substrate;
a light guide formed on the CMOS image sensor substrate to receive light traveling parallel to a plane of the pixel array and incident on the edge of the CMOS image sensor and to re-direct the incident light into at least one pixel of the pixel array.

2. The apparatus of claim 1 wherein the pixel array is formed on a front side of the CMOS image sensor substrate and the light guide is formed on the front side of the CMOS image sensor substrate over the pixel array.

3. The apparatus of claim 1 wherein the pixel array is formed on a front side of the CMOS image sensor substrate and the light guide is formed on a back side of the CMOS image sensor substrate.

4. The apparatus of claim 1 wherein the light guide includes an inclined reflective surface positioned at a selected angle relative to the plane of the pixel array.

5. The apparatus of claim 4 wherein the selected angle is 45 degrees.

6. The apparatus of claim 4 wherein the light guide further comprises:
a first reflective surface abutting one edge of the inclined surface; and
a second reflective surface spaced apart from the first reflective surface, the second reflective surface abutting another edge of the inclined surface.

7. The apparatus of claim 6 wherein the first reflective surface forms a mask to allow light to reach only selected pixels in the pixel array.

8. The apparatus of claim 7 wherein the selected pixels form one or more lines of pixels on the pixel array.

9. The apparatus of claim 7 wherein the mask includes two or more separate openings.

10. The apparatus of claim 6 wherein the light guide further comprises a transparent material disposed in the volume bounded by the first reflective surface, the second reflective surface, the inclined reflective surface and a radiation entry of the light guide.

11. The apparatus of claim 1, further comprising an anti-reflective coating formed between the pixel array and the light guide to block visible light from reaching selected pixels while allowing infra-red or near infra-red light to reach the selected pixels.

12. An optical touch-screen imager comprising:
a substantially planar touch area;
a detector positioned adjacent to the touch area, the detector comprising:
a CMOS image sensor including a pixel array formed in a CMOS image sensor substrate, the image sensor being positioned so that a plane of the pixel array is substantially parallel to the plane of the touch area, and
a light guide formed on the CMOS image sensor substrate to receive light traveling parallel to a plane of the pixel array and incident on the edge of the CMOS image sensor and to re-direct the incident light into at least one pixel of the pixel array.

13. The optical touch-screen imager of claim 12 wherein the touch area is a quadrilateral and detector is positioned at a corner of the quadrilateral.

14. The optical touch-screen imager of claim 12, further comprising a radiation source to transmit radiation that travels in a plane substantially parallel to the plane of the imaging area.

15. The optical touch-screen imager of claim 12 wherein the source radiates infra-red or near infra-red radiation.

16. The optical touch-screen imager of claim 12 wherein the pixel array is formed on a front side of the CMOS image sensor substrate and the light guide is formed on the front side of the CMOS image sensor substrate over the pixel array.

17. The optical touch-screen imager of claim 12 wherein the pixel array is formed on a front side of the CMOS image sensor substrate and the light guide is formed on a back side of the CMOS image sensor substrate.

18. The optical touch-screen imager of claim 12 wherein the light guide further comprises:
   an inclined reflective surface positioned at a selected angle relative to the plane of the pixel array;
   a first reflective surface abutting one edge of the inclined surface; and
   a second reflective surface spaced apart from the first reflective surface, the second reflective surface abutting another edge of the inclined surface.

19. The optical touch-screen imager of claim 18 wherein the first reflective surface forms a mask to allow light to reach only selected pixels in the pixel array.

20. The optical touch-screen imager of claim 19 wherein the mask includes two or more separate openings.

21. The optical touch-screen imager of claim 18, further comprising an anti-reflective coating formed between the pixel array and the light guide to block visible light from reaching selected pixels while allowing infra-red or near infra-red light to reach the selected pixels.

22. A process comprising:
   forming a pixel array in a CMOS image sensor substrate;
   forming a light guide on the CMOS image sensor substrate to receive light traveling parallel to a plane of the pixel array and incident on the edge of the CMOS image sensor, and to re-direct the incident light into at least one pixel of the pixel array.

23. The process of claim 22 wherein the pixel array is formed on a front side of the CMOS image sensor substrate and the light guide is formed on the front side of the CMOS image sensor substrate over the pixel array.

24. The process of claim 22 wherein the pixel array is formed on a front side of the CMOS image sensor substrate and the light guide is formed on a back side of the CMOS image sensor substrate.

25. The process of claim 22 wherein forming the light guide comprises:
   forming an inclined reflective surface positioned at a selected angle relative to the plane of the pixel array
   forming a first reflective surface abutting one edge of the inclined surface; and
   forming a second reflective surface spaced apart from the first reflective surface, the second reflective surface abutting another edge of the inclined surface.

26. The process of claim 25 wherein the first reflective surface forms a mask to allow light to reach only selected pixels in the pixel array.

27. The process of claim 26 wherein the mask includes two or more separate openings.

28. The process of claim 25, further comprising disposing a transparent material in the volume bounded by the first reflective surface, the second reflective surface, the inclined reflective surface and a radiation entry of the light guide.

29. The process of claim 28, further comprising a layer of planarizer or adhesive formed over the first reflective surface, the second reflective surface, and the inclined reflective surface.

30. The process of claim 29, further comprising a cover formed on the planarizer or adhesive.

31. The process of claim 30 wherein the cover is a glass plate or a silicon layer.

32. The process of claim 30 wherein the cover is spaced apart from the plane of the pixel array by a clear spacer.

33. The process of claim 22, further comprising forming an anti-reflective coating between the pixel array and the light guide to block visible light from reaching selected pixels while allowing infra-red or near infra-red light to reach the selected pixels.

* * * * *